(12) United States Patent
Yoshizawa et al.

(10) Patent No.: US 6,720,644 B2
(45) Date of Patent: Apr. 13, 2004

(54) SEMICONDUCTOR DEVICE USING INTERPOSER SUBSTRATE AND MANUFACTURING METHOD THEREFOR

(75) Inventors: Akira Yoshizawa, Saitama (JP); Tetsu Ishiyama, Miyagi (JP); Yoshiyuki Nakamura, Chiba (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/970,593

(22) Filed: Oct. 4, 2001

(65) Prior Publication Data
US 2002/0084522 A1 Jul. 4, 2002

(30) Foreign Application Priority Data

Oct. 10, 2000 (JP) .................................. P2000-309506
May 16, 2001 (JP) ................................... P2001-147024

(51) Int. Cl.[7] .......................... H01L 23/48; H01L 23/04
(52) U.S. Cl. ...................... 257/692; 257/698; 257/700; 257/758; 257/774
(58) Field of Search ................. 257/692, 698, 257/700, 758, 774, 737, 666, 671, 673, 676, 696, 701, 748

(56) References Cited

U.S. PATENT DOCUMENTS 5,949,142 A * 9/1999 Otsuka ....................... 257/737
6,420,664 B1 * 7/2002 Muramatsu et al. ........ 174/262

* cited by examiner

Primary Examiner—Minhloan Tran
Assistant Examiner—Tan Tran
(74) Attorney, Agent, or Firm—Sonnenschein, Nath & Rosenthal LLP

(57) ABSTRACT

A semiconductor formed by mounting a semiconductor chip on an interposer substrate and the manufacturing method therefor is disclosed. This semiconductor device includes a semiconductor chip having a plurality of electrodes formed on the surface thereof, and an interposer substrate on which the semiconductor chip is mounted. The interposer substrate has a core substrate, and built-up layers having more flexibility than the core substrate is built on only one surface of the core substrate, while the semiconductor chip is mounted on the other surface of the core substrate via an anisotropic conductive layer. The electrodes on the semiconductor chip and those provided on the core substrate are electrically connected via the anisotropic conductive layer, and the connection portions provided at the built-up layer is connected to predetermined patterns on a motherboard.

3 Claims, 9 Drawing Sheets

SEMICONDUCTOR DEVICE USING INTERPOSER SUBSTRATE AND MANUFACTURING METHOD THEREFOR

RELATED APPLICATION DATA

The present application claims priority to Japanese Application(s) No(s). P2000-309506 filed Oct. 10, 2000, and P2001-147024 filed May 16, 2001, which application(s) is/are incorporated herein by reference to the extent permitted by law.

BACKGROUND OF THE INVENTION

1. Field of the Invention

The present invention relates to a semiconductor device and a method for manufacturing the same, particularly to a semiconductor formed by mounting a semiconductor chip on an interposer substrate and the manufacturing method therefor.

2. Description of the Related Art

In the semiconductor chip having a plurality of elements built therein and circuit patterns formed thereon, the pitch among the electrodes which are formed on one surface of the semiconductor chip is very small. As a result, if such a semiconductor chip is directly mounted on a motherboard, there is a risk that the electrodes peel off, or that the semiconductor chip is damaged, since there is a large difference in the thermal expansion coefficient between the semiconductor chip and the motherboard. Accordingly, a semiconductor device is used wherein a semiconductor chip is mounted on one surface of an interposer substrate which is a size larger than the semiconductor chip, wherein electrodes having a larger pitch than that of the electrodes on the semiconductor chip are formed on the other surface of the interposer substrate, and wherein the semiconductor device is mounted on the motherboard making use of these electrodes of the interposer substrate.

FIG. 11 shows a conventional semiconductor device 1 as described above. The semiconductor 1 is mounted on an interposer substrate 2. Solder bumps 3 are affixed on electrodes 4 and on the bottom surface of the semiconductor chip. The solder bumps 3 are bonded, by soldering, to the electrodes 4 which are formed on the surface of the interposer substrate 2 and each of which is constituted of a conductor pattern. As a solder for connecting the solder bumps 3 to the conductor patterns 4, a solder having a melting point lower than that of the solder of the solder bumps 3 is used.

In this manner, the semiconductor chip 1 mounted on the interposer substrate 2 becomes mechanically strong, and the distance between adjacent electrodes on the interposer substrate 2 can be made larger than the distance between adjacent electrodes on the semiconductor chip 1, so that mounting works with the interposer substrate 2 and semiconductor chip 1 are facilitated.

The reliability of bonding the semiconductor chip shown in FIG. 11 to the motherboard by soldering involves a problem. That is, as the motherboard, a substrate formed of an organic material which is inexpensive and relatively flexible is generally used, but such a substrate requires giving consideration to a sufficient relaxation of thermal stress.

In the flip-chip mounting method, wherein the electrode surface of the semiconductor chip 1 is used as a bonding surface with the interposer substrate 2, a ceramic material which is expensive and relatively hard, an aramid material which has an elastic modulus close to that of the semiconductor chip 1, or the like is employed. Also, when a film-shaped flexible substrate is used, a resin is interposed between the semiconductor chip and the flexible substrate, thereby both the flexible substrate and the semiconductor chip are fixedly adhered with reliability. Therefore, even if the semiconductor chip itself presents no problem, a problem of stress concentration occurs at the solder bonding portion between the electrodes on the interposer substrate and the connecting lands of the motherboard. It is difficult, therefore, to adopt the LGA (Land Grid Array) method, which is a method of forming connecting lands with solder without using solder bumps, and which is difficult to absorb stress.

When using a built-up substrate as a conventional interposer substrate 2, a construction wherein any surface of the interposer substrate is constituted of a built-up layer is used. Herein, since the top surface of the interposer substrate 2 constitutes the mounting surface of the semiconductor chip 1, the built-up layer of this mounting surface requires flatness and a low thermal expansion coefficient. In contrast, the built-up layer on the bottom surface side of the interposer substrate 2 constituting a bonding surface with the motherboard, requires the stress relaxation function required when connected to the motherboard, so that this built-up layer must be formed of a material having flexibility, or, low elastic modulus.

Hence, in the interposer substrate 2, the built-up layer at the portion to be bonded to semiconductor chip 1 above the interposer substrate 2 must be made of a relatively hard material, while the built-up layer on the bottom surface side of the interposer substrate to be bonded to the motherboard must be made of a soft material. This means that mutually different type of materials are employed for the interposer substrate. This raises problems in that the manufacturing cost of interposer substrate 2 increases and the manufacturing process thereof becomes complicated.

SUMMARY OF THE INVENTION

The present invention has been achieved to solve the above-described problems, and the object thereof is to provide a semiconductor device which allows the reliability of the connection of the interposer substrate to the semiconductor chip and the reliability of the connection of the chip-size package to the motherboard to be compatible with each other, and to provide the manufacturing method therefor.

In order to achieve the above-described object, the present invention provides a semiconductor device comprising a silicon semiconductor chip which has a plurality of circuit elements built therein and circuit patterns formed thereon using the diffusion technique or the like, and which has a plurality of electrodes formed on the outer surface thereof; an interposer substrate on which the semiconductor chip is mounted; a core substrate constituting the base of the interposer substrate; built-up layers built on only one surface of the core substrate; an anisotropic conductive layer which is formed on the other surface of the core substrate, and via which the semiconductor chip is mounted on the core substrate. In this semiconductor device, electrodes on the core substrate and those on the semiconductor chip are electrically connected via the anisotropic conductive layer.

Herein, the built-up layers formed on the core substrate may have an elastic modulus of 5000 MPa (SI unit) or below. Also, the elastic modulus of the built-up layers may be smaller than or equal to a half of that of the core substrate. The built-up layers may have curved wiring patterns formed on the surface thereof so as to relax stress. Also, the core substrate may be formed of a material having a thermal expansion coefficient relatively close to that of the semiconductor chip, and the core may have a thickness of 0.5 mm or below.

On the surface of the core substrate on which the built-up layers are formed, the patterns subjected to the pressing force in the bonding of the anisotropic conductive layer may be formed at the positions corresponding to the electrodes of the semiconductor chip. The arrangement may be such that the interposer substrate is constructed by forming a plurality of built-up layers on the core substrate, that electrodes are formed so as to pass through the outermost built-up layer, and that these electrodes constitute electrodes connected to the motherboard.

The method for manufacturing the semiconductor device in accordance with the present invention comprises preparing an interposer substrate by forming built-up layers on one surface of a core substrate; mounting the semiconductor chip, via an anisotropic conductive layer, on the other surface opposite to the one surface on which the built-up layers of the core substrate have been formed; and electrically connecting the electrodes on the semiconductor chip and those on the other surface of the core substrate via the anisotropic conductive layer.

The method for manufacturing the semiconductor device in accordance with the present invention may be such that holes are formed in a built-up layer; the surface of the built-up layer including the holes are plated with a conductive metal, the plated layer is etched; and thereby wiring patterns and vias (conductive portions) are simultaneously formed on the built-up layer. By repeating these processes, a plurality of built-up layers is successively formed on one surface of the core substrate.

Here, preferred embodiments of the present invention will be listed below.

(1) A semiconductor device using one-side built-up layer substrate wherein no built-up layer is formed on the semiconductor mounting surface of the core substrate constituting the base of the interposer substrate, and wherein the arrangement is such that the semiconductor chip is stably connected onto the wiring pattern formed on the semiconductor mounting surface of the core substrate via an anisotropic conductive layer.

(2) A semiconductor device having a structure in which the built-up layers formed on the surface of the core substrate opposite to the semiconductor mounting surface has a flexible physical property such as to preferably have an elastic modulus of 5000 MPa or below, and more preferably 2500 MPa or below, and which allows the warp of the core substrate and the stress on the motherboard to be relaxed.

(3) A semiconductor device which is arranged to have a plurality of built-up layers, and to make the shape of the pattern interposed between the built-up layers a curved wiring pattern, and to relax thermal stress by virtue of this curved shape.

(4) A semiconductor device which is arranged so that the core substrate thereof constituting the base of the interposer substrate is a thin substrate formed of a material having a low thermal expansion coefficient, such as an glass-fiber epoxy resin, and that the interposer substrate preferably has a thickness of 0.5 mm or below, and more preferably 0.2 mm or below, and that the stress due to the difference in the thermal expansion between the semiconductor chip and the core substrate is reduced.

(5) A semiconductor device wherein a semiconductor chip is mounted on the interposer substrate thereof, and wherein reinforced patterns subject to a pressing force when adding the pressing force to the anisotropic conductive layer for connecting the electrodes of this semiconductor chip and those of the interposer substrate, are formed on the rear surface of the core substrate.

(6) A semiconductor device in which no lead-out of the wiring is formed on the lower portion of the interposer substrate, and below the reinforced pattern subject to a pressing force of the anisotropic conductive layer connecting the electrode of the semiconductor chip and that of the core substrate, and which thereby allows through-holes to be formed under the above-described reinforced pattern, in the motherboard.

(7) A semiconductor device which does not require forming a protective resist for protecting wiring on the surface of the core substrate, on the surface of the core substrate carrying the semiconductor chip, the surface having no built-up layer formed.

Here, the thermal expansion coefficient of silicon is about 2 to 3 ppm/C. °. As the core substrate 12, a glass-fiber epoxy resin substrate having a thermal expansion coefficient of about 5 to 13 ppm/C. °, which is relatively close to the thermal expansion coefficient of silicon. Meanwhile, a first built-up layer 13 and a second built-up layer 14 are each constituted of a resin layer such as an epoxy resin layer or a bismuth imide resin layer having a thermal expansion coefficient of about 80 to 100 ppm/C. °.

With regard to the elastic modulus, as the core substrate 12 in accordance with this embodiment, constituted of a glass fiber epoxy resin, one which has an elastic modulus of 10,000 to 30,000 MPa was used. As the first and second built layers 12 and 13, one which has an elastic modulus of 3,500 MPa or below, that is, one which is more flexible than the core substrate.

The above and other objects, features, and advantages of the present invention will be clear from the following detailed description of the preferred embodiments of the invention in conjunction with the accompanying drawings.

BRIEF DESCRIPTION OF THE DRAWINGS

FIGS. 6A to 6F are vertical sectional views showing the main portions of the manufacturing method for the semiconductor device shown in FIG. 1;

DESCRIPTION OF THE PREFERRED EMBODIMENTS

Figure 1:
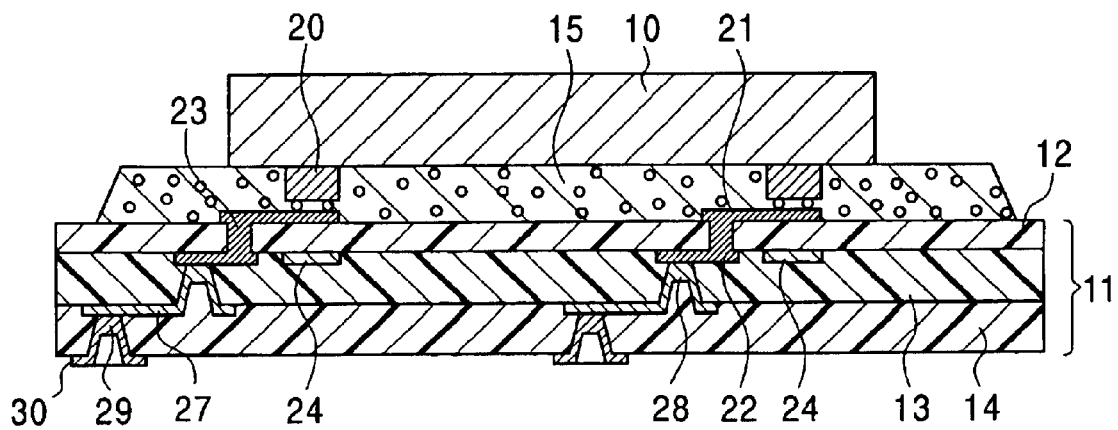
FIG. 1 is an enlarged sectional view showing the main section of a semiconductor in accordance with an embodiment of the preset invention.

FIGS. 1 to 4 shows a semiconductor device in accordance with an embodiment of the present invention. As shown in FIG. 1, this semiconductor device comprises a semiconductor chip 10 which is formed of silicon, and which has a plurality of elements built therein and a circuit pattern thereon; and an interposer substrate 11 having a larger area than that of the semiconductor chip. The interposer substrate 11 comprises a core substrate 12; a first built-up layer 13 laminated over one surface of the core substrate 12, that is, the bottom surface thereof shown in FIG. 1; and a second built-up layer 14 further laminated over the bottom surface of the first built-up layer 13. Herein, the core substrate 12 of the interposer substrate 11 and the semiconductor chip 10 are bonded via an anisotropic conductive layer 15.

Figure 4A:
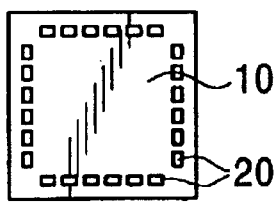
FIGS. 4A to 4J are exploded views showing the semiconductor device shown in FIG. 1.
Figure 4B:
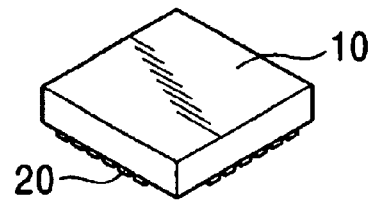

As shown in FIGS. 1 and 4A, gold bumps 20 are formed on a plural electrodes on the semiconductor chip 10. On the other hand, wiring patterns 21 formed of copper foil are formed on the top surface of the core substrate 12 of the interposer substrate 11, and wiring patterns 22 are formed of the same copper foil as that of the wiring patterns 21 are formed on the bottom surface the core substrate. These wiring patterns 21 and 22 are interconnected through through-holes (conductive portions) 23. Particularly, as shown in FIG. 4C, on the bottom surface of the core substrate 12, reinforced patterns 24 having a flat trapezoidal shape are formed of the same copper foil as that of the wiring patterns 22, at the positions corresponding to the gold bumps on the semiconductor chip 10.

Figure 4C:
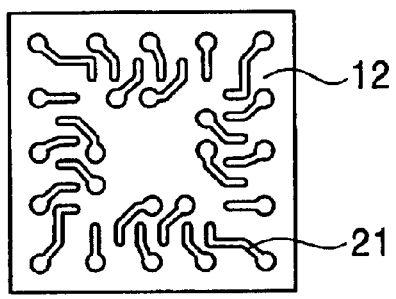

As can be seen from FIG. 4C showing the bottom surface of the core substrate having a larger area than that of the semiconductor chip 10, the plurality of electrodes on the semiconductor chip are created in a manner such as to be dispersed with the reinforced patterns 24 interposed between the inside and outside on the core substrate, so that enlarged distance between electrodes (electrode pitch) is achieved.

Next, wiring patterns 27 are formed on the bottom surface of the first built-up layer 13 of the interposer substrate 11, and are each connected to the wiring patterns 22 of the core substrate 12 through vias (conductive portions) 28. Also, vias (conductive portions) 29 are formed in the second built-up layer 14, and are connected to the wiring patterns 27 on the first built-up layer 13. At the peripheral portion of the vias 29, an electrode 30 is formed so as to be positioned on the outer surface of the second built-up layer 14. The electrode 30 is an electrode for connecting the interposer substrate 11 and the motherboard 34.

Figure 3:
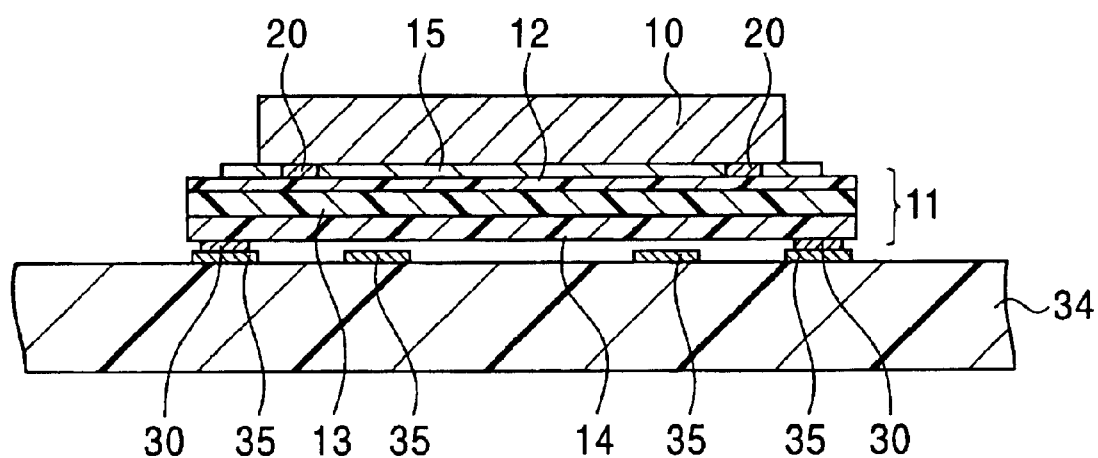
FIG. 3 is a sectional view showing a motherboard on which the semiconductor device shown in FIG. 1 is mounted.

FIG. 3 shows a semiconductor mounting device wherein such a semiconductor device is mounted on the motherboard 34. Wiring patterns 35 are formed on the top surface of the motherboard 34, and these wiring patterns 35 and the electrode 30 formed on the bottom surface of the interposer substrate 11 and on the outer surface of the second built-up layer 14 are connected by solder.

Figure 2A:
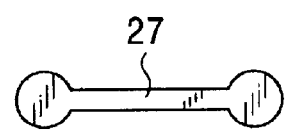
FIGS. 2A and 2B are plan views each showing a wiring pattern.
Figure 2B:
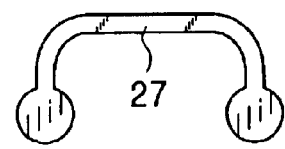
Figure 4D:
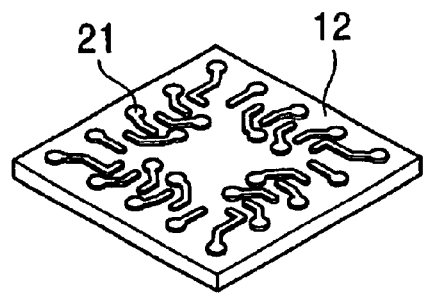
Figure 4E:
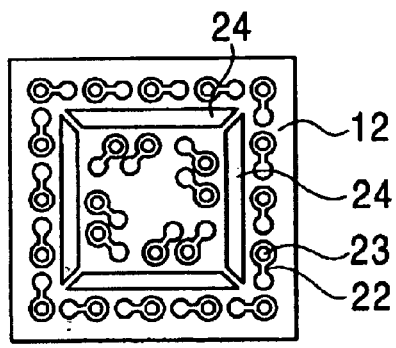
Figure 4F:
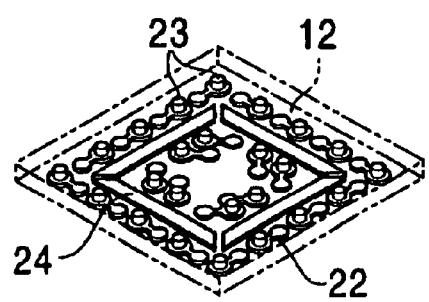
Figure 4G:
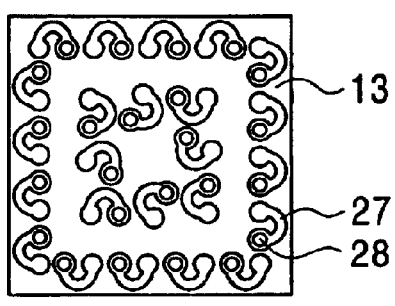
Figure 4H:
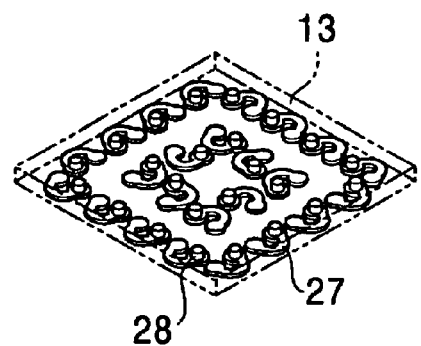
Figure 4I:
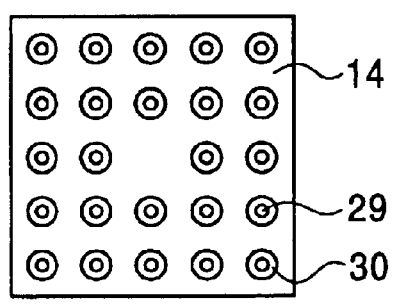
Figure 4J:
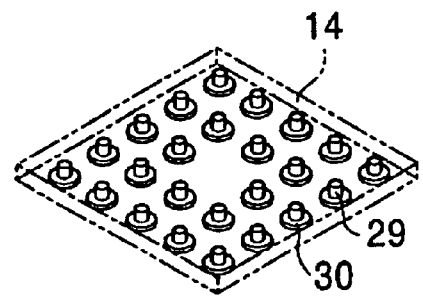

In such a semiconductor device, particularly, the wiring patterns 27 formed on the surface of the first built-up layer 13 of the interposer substrate 11 does not have a straight shape as shown in FIG. 2A, but has a smoothly curved shape without acute corners, as shown in FIG. 2B. Such shapes are also shown in FIG. 4D. Forming the wiring patterns 27 as such curved wiring patterns allows the patterns 27 to relax stress by the deformation of itself, thereby preventing break accidents of the semiconductor device due to breaks of the wiring patterns 27.

In this manner, the semiconductor device in accordance with this embodiment is formed by particularly using a one-side interposer substrate 11 as shown in FIG. 1, and by flip-chip mounting the semiconductor chip 10 via the anisotropic conductive layer 15. The semiconductor chip 10 has gold bump 20 formed in advance, a thermal pressure-contact is performed for the wiring patterns 21 on the core substrate 12 via the conductive particles of the anisotropic conductive layer 15, thereby the semiconductor chip 10 and the interposer substrate 11 are bonded together, and then gold bumps 20 on the semiconductor chip 10 and the wiring patterns 21 formed on the uppermost surface of the interposer substrate 11 are electrically connected.

Herein, by using a material having a low thermal expansion coefficient which is close to that of the semiconductor chip 10, such as a glass-fiber epoxy rein, as the core substrate 12 constituting the uppermost layer of the interposer substrate 11, the stress applied to the bonding portion between the core substrate 11 and the semiconductor chip 10 due to temperature change is relaxed as much as possible, and the adhesion strength by the anisotropic conductive layer 15 is secured.

As is seen from FIG. 1, there is no resist layer formed on the lowermost layer of the interposer substrate 11. The vias 29 (conductive portion) in the second built-up layer 14 is connected to the wiring patterns 27 formed on the surface of the built-up layer 13, and by using these vias as the bonding surfaces between the motherboard 34 and the second built-up layer 14, the necessity for the wiring protection by a resist can be eliminated.

Figure 5:
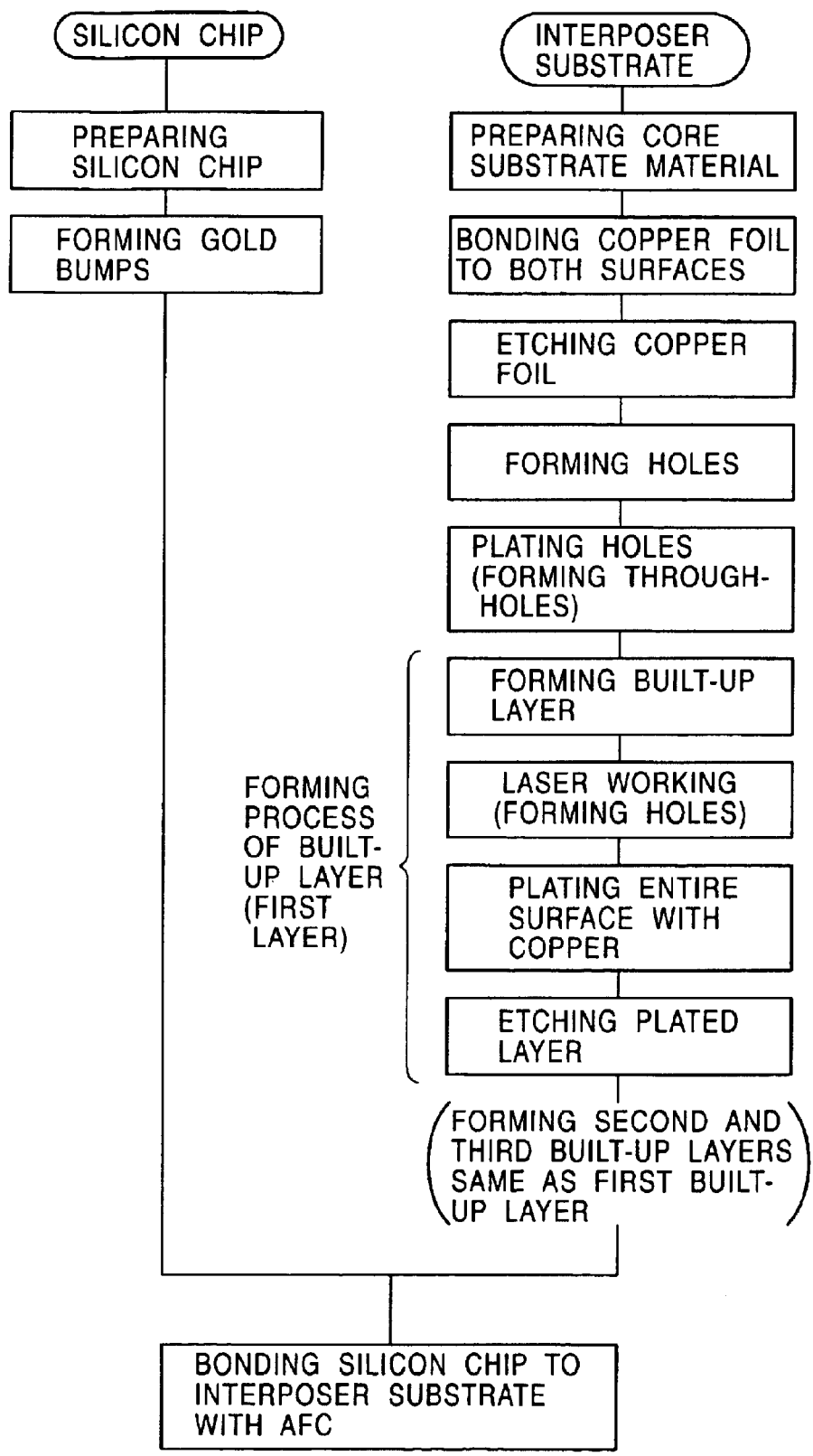
FIG. 5 is a process chart showing the manufacturing method for the semiconductor device shown in FIG. 1.

Next, a manufacturing method for such a semiconductor device will be described with reference to FIGS. 5 and 6. As shown in FIG. 5, with regard to the semiconductor chip 10, a silicon chip having a plurality of elements built therein and circuitry formed thereon is prepared, and gold bumps 20 are formed on the silicon chip.

Figure 6B:
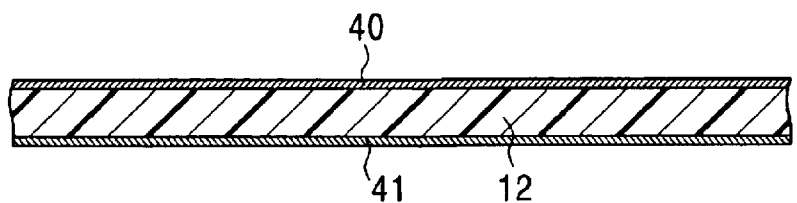
Figure 6B:
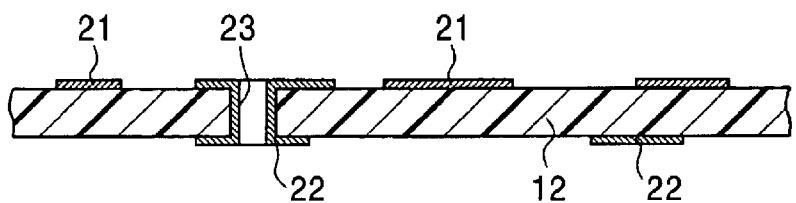

On the other hand, with regard to the interposer substrate 11, firstly the material of the core substrate 12 constituted of a glass-fiber epoxy resin substrate is prepared. Then, as shown in FIG. 6A, copper foil 40 and 41 is bonded to both surfaces of the core substrate 12. Next, as shown in FIG. 6B, the copper foil 40 and 41 is etched, and thereby predetermined wiring patterns 21 and 22 are formed. Thereafter, by forming holes in the core substrate 12, and by plating these holes, through-holes (conductive portions) 23 are formed, and then required wiring patterns 21 and 22 on both surfaces of the core substrate 12 are interconnected.

Figure 6C:
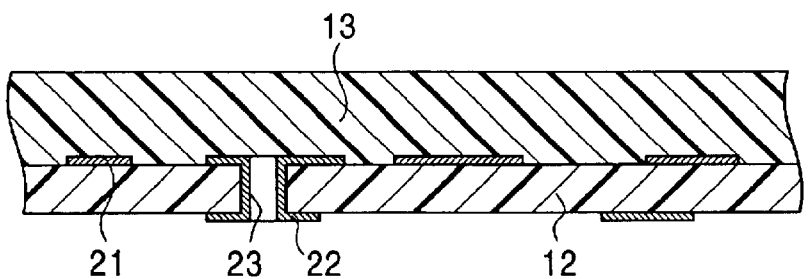
Figure 6D:
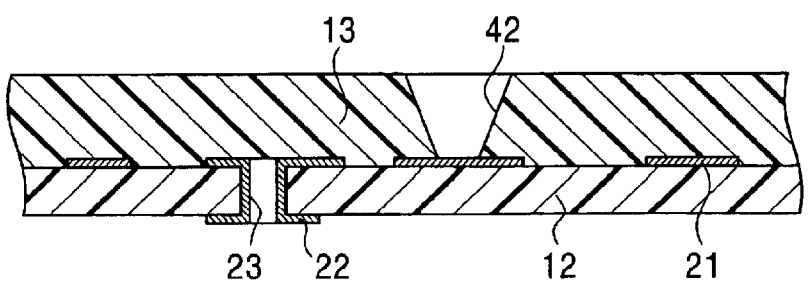
Figure 6E:
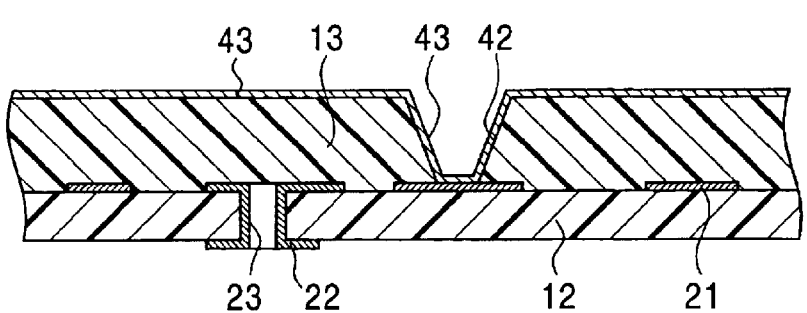
Figure 6F:
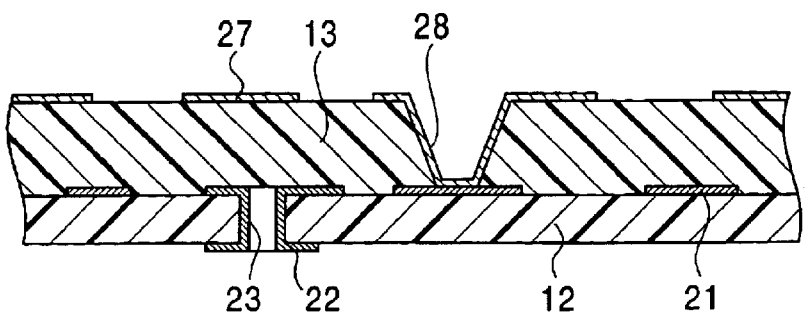

Next, as shown in FIG. 6C, the first built-up layer 13 is formed on one surface of the core substrate 12. Specifically, the first built-up layer 13 is formed by applying an epoxy resin or bismuth imide resin to the core substrate 12 so as to have a predetermined thickness, and by curing it. Then, as shown in FIG. 6D, laser working is performed for the first built-up layer 13 to make holes 42. Next, as shown in FIG. 6E, by performing copper-plating 43 for the entire surface of the first built-up layer 13, and by etching this copper plating 43, predetermined wiring patterns 27 as shown in FIG. 6F are formed.

Thereafter, by repeating the processes shown in FIGS. 6C to 6F, the second built-up layer 14 is formed. As needed, built-up layers can be further laminated over the core substrate 12. The total number of built-up layers is not limited to the embodiment of the present invention. Any one of a single layer, two layers, or multiple layers more than two layers can be adopted.

After the interposer substrate 11 has been manufactured in this manner, the semiconductor chip 10 is mounted thereon, and the interposer substrate 11 and semiconductor chip 10 are bonded together via the anisotropic conductive layer 15, and the electrical connection between the gold bumps 20 on the semiconductor chip 10 and the wiring patterns 21 on the top surface of the interposer substrate 11 is established.

Figure 7:
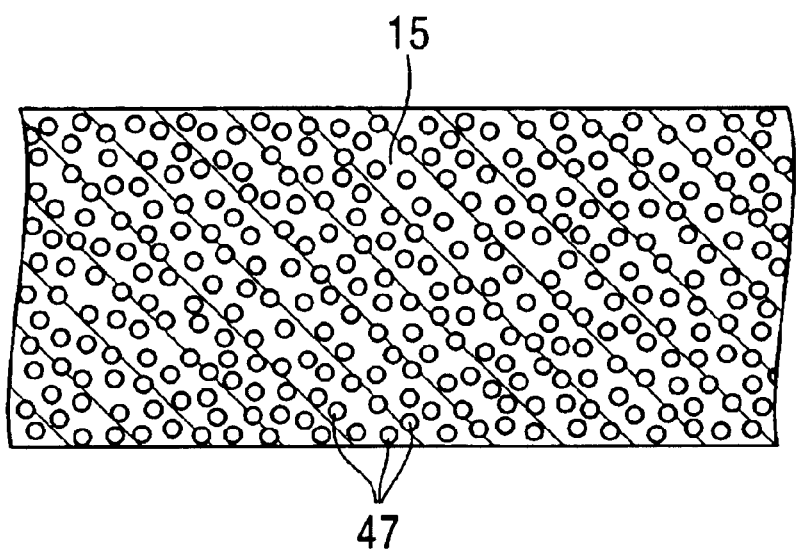
FIG. 7 is a sectional view showing an anisotropic conductive film.
Figure 8:
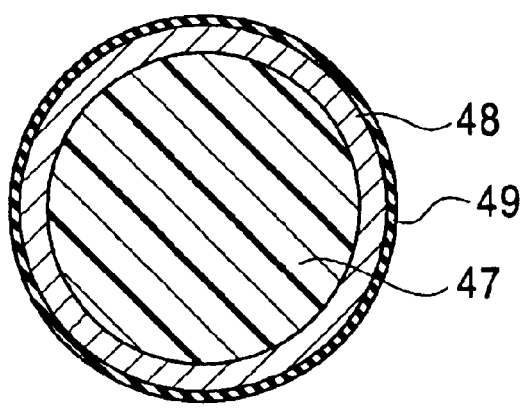
FIG. 8 is a sectional view showing a resin particle.

Next, the anisotropic conductive layer 15 for connecting the semiconductor chip 10 and the interposer substrate 11 will be described with reference to FIGS. 7 to 9. The anisotropic conductive layer 15 is constituted of an anisotropic conductive film, and, as shown in FIG. 7, the anisotropic conductive layer 15 has a structure such that resin particles 47 are dispersed into a matrix resin such as epoxy resin. Each of the resin particles 47 is of a spherical shape as shown in FIG. 8, and has a metallic layer 48 constituted of metallic plating formed at the outer peripheral portion thereof, and further has a thin insulating film 49 formed so as to cover the outside of the outer peripheral portion.

Figure 9:
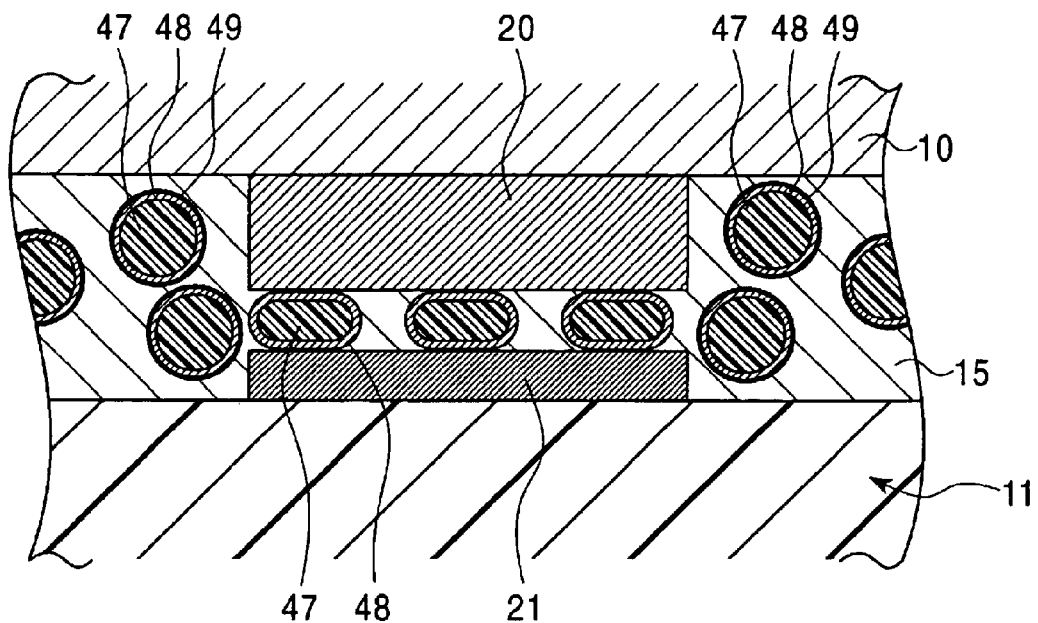
FIG. 9 is a main-portion enlarged sectional view showing a connection state by an anisotropic conductive layer.

When applying heat and pressure to such an anisotropic conductive layer 15 while interposing it between the semiconductor chip 10 and the interposer substrate 11, as shown in FIG. 9, the resin particles 47 are crushed between the electrodes 20 on the semiconductor chip 10 and the electrodes 21 on the interposer substrate 11 because of the heights of these electrodes 20 and 21, and consequently the insulating film outside 49 is destructed, resulting in exposed metallic layers 48. Thereby, the electrical connection, by the resin particles, between the electrodes 20 on the semiconductor chip 10 and the electrodes 21 on the interposer substrate 11 is achieved. On the other hand, in the area where the electrodes 20 and 21 do not exist, the resin particles 47 maintain the shape thereof as it is, since the gap between the semiconductor chip 10 and the interposer substrate 11 is large. As a result, short-circuits are prevented by the insulating films 49 over the outer peripheral surface. That is, the electrical conduction at other areas than the electrodes 20 and 21 is inhibited, and thereby selective electrical connection is attained.

In this manner, the anisotropic conductive layer 15 simultaneously achieves three functions: the bonding between the semiconductor chip 10 and the interposer substrate 11, the electrical conduction between the electrodes thereon 20 and 21, and the insulation at the area where the electrodes 20 and 21 are not formed. Thus, when performing a thermal pressure-contact for the anisotropic conductive layer 15 in the state of being sandwiched between the semiconductor chip 10 and the interposer substrate 11, the anisotropic conductive layer 15 exhibits electrical anisotropy such as to have electrical conductivity in the film-thickness direction thereof, and to have electrical insulativity in the surface direction thereof.

The semiconductor device in accordance with this embodiment provides technical advantages as follows:

(1) With regard to the connection when using the anisotropic conductive layer 15, the necessity for resists to be each provided on the uppermost surface of the interposer substrate 11 and the outer surface of the second built-up layer 14 is eliminated. In particular, since the necessity to newly form a protective resist on the bonding surface between the core substrate 12 and the semiconductor chip 10 is obviated, there exist no voids due to bubbles occurring from the protective resist owing to the heating during bonding. This allows a stable connection, by the anisotropic conductive layer 15, between the gold bumps 20 on the semiconductor chip 10 and the wiring patterns 21 on the interposer substrate 11.

(2) As described above, the thermal expansion coefficient of the semiconductor chip 10 constituted of silicon is 2 to 3 ppm/° C. In this embodiment, for the core substrate 12, a material was used which has a thermal expansion coefficient of about 5 to 13 ppm/C. °, i.e., a thermal expansion coefficient relatively close to that of the semiconductor chip 10, and which has a relatively high hardness, i.e., a high elastic modulus, and the semiconductor chip 10 and this core substrate 12 are bonded together, with the anisotropic conductive layer 15 interposed therebetween. Therefore, the semiconductor chip 10 and the core substrate 12 are prevented from mechanical stress due to heating, thereby improving the reliability of this embodiment.

(3) Since the built-up layers 13 and 14 having a relatively high flexibility, or, a low elastic modulus are formed on one surface of the core substrate 12 constituting the base of the interposer substrate 11, the built-up layers 13 and 14 can perform the function of relaxing stress due to thermal strains at the solder bonding portions between the interposer substrate 11 and the motherboard 34 which is formed of a relatively flexible organic material.

(4) In the built-up layers 13 and 14 constituted of a flexible material for thus realizing the relaxation of stress between the interposer substrate 11 and the motherboard 34, curved wiring patterns 27 as shown in FIG. 2B are formed on the surface of the built-up layer 13, so that the reliability of this embodiment is more improved.

(5) Since, on the surface of the core substrate 12, reinforced patterns 24 are formed at the positions corresponding to the gold bumps 20 on the semiconductor chip 10, it becomes possible to cause the core substrate 12 to stably receive a pressing force without much deforming when the connection of the gold bumps thereto is performed through the anisotropic conductive layer 15, so that the core substrate 12 is prevented from undergoing undue forces.

Figure 10:
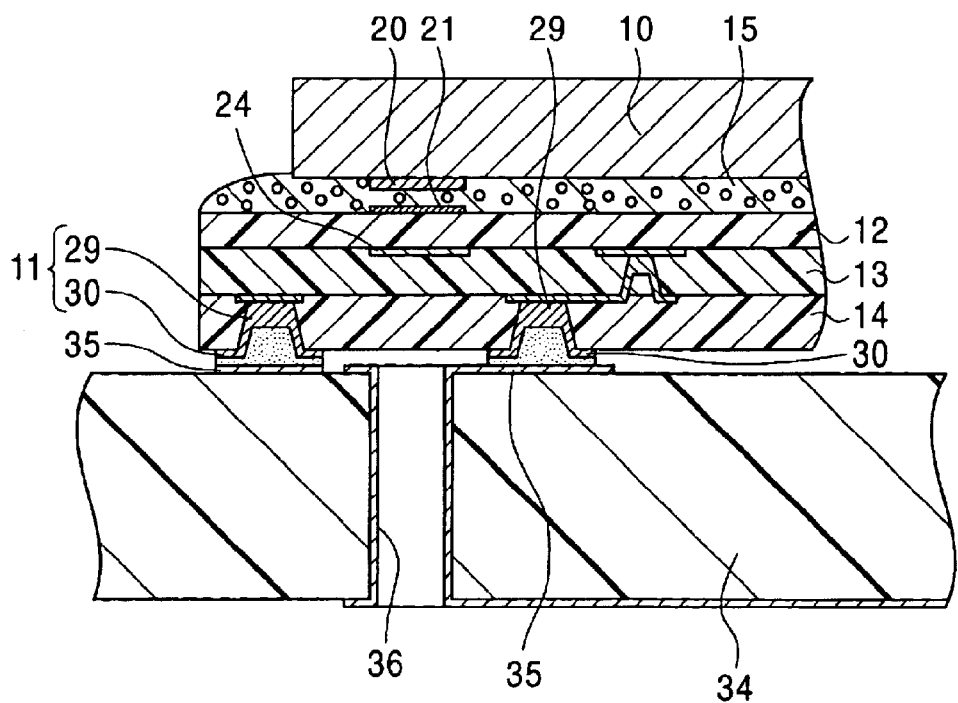
FIG. 10 is a main-portion enlarged sectional view showing a connection state of a modification of the semiconductor in accordance with the present invention.
Figure 11:
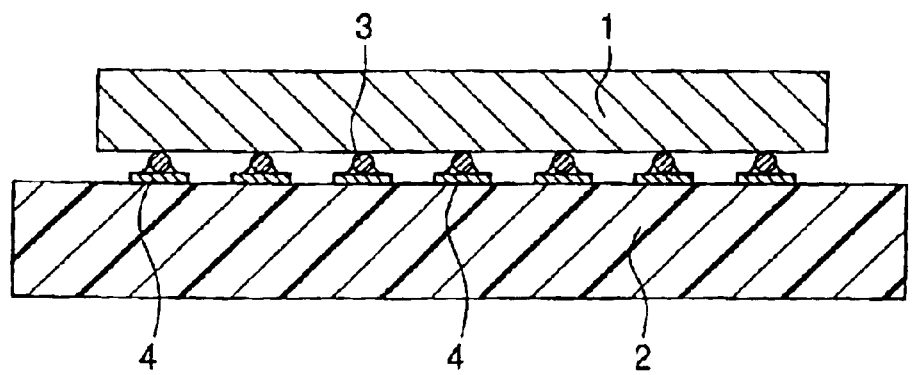
FIG. 11 is a vertical sectional view showing a conventional chip-size package semiconductor device.

(6) When forming the electrode 30 in the second built-up layer 14, as shown in FIG. 10, at the position deviated with respect to the reinforced pattern 24 without forming wiring in the built-up layers 13 and 14, on the bottom surface of side of the reinforced pattern 24, which is subjected to the pressing force of the anisotropic conductive layer 15 when connecting the gold bumps 20 on the semiconductor chip 10 and the wiring patterns 21 on the interposer substrate 11, in particular, the positions of the motherboard 34 carrying the semiconductor device, corresponding to the above-described reinforced patterns, can be utilized as spaces for forming through-holes. Thereby, in this case, the wiring of the motherboard 34 is given leeway for the layout thereof.

(7) Since a resist layer for protecting the wiring patterns 21 is not formed on the top surface of the interposer substrate 11 carrying the semiconductor chip 10, reduction in the manufacturing cost can be realized.

(8) Since the interposer substrate 11 uses a substrate constituted of one-side built-up layers, the anisotropic conductive layer 15 allows the process management cost to be reduced, and enables a high-reliability and stable chip-size package to be provided.

As is evident from foregoing, the semiconductor device in accordance with the present invention has a structure wherein a semiconductor chip is formed on the core substrate side surface of the one-side built-up layer type interposer substrate in which built-up layers are formed on only one surface of the core substrate, so that the stress between the interposer substrate and the semiconductor chip is eliminated by the core substrate, and the stress relaxation when the semiconductor is mounted on the motherboard can be realized by the built-up layers, thereby a semiconductor which exhibits a reliable stability with respect to temperature changes can be provided.

The manufacturing method for a semiconductor device in accordance with the present invention allows a semiconductor device which is highly resistant to thermal stress to be stably provided. In addition, since the connection and bonding between the semiconductor chip and the built-up substrate are performed via the anisotropic conductive layer 15, the manufacture of the semiconductor device in accordance with the present invention is facilitated and the manufacturing process thereof can be simplified.

While the present invention has been described with reference to what are at present considered to be the preferred embodiments, it is to be understood that various changes and modifications may be made thereto without departing from the invention in its broader aspects and therefore, it is intended that the appended claims cover all such changes and modifications that fall within the true spirit and scope of the invention.

What is claimed is:

1. A semiconductor divice comprising:

a semiconductor chip having a plurality of electrodes formed on the surface thereof;

an interposer substrate on which said semiconductor chip is mounted;

a core substrate constituting the base of said interposer substrate;

built-up layers built on only one surface of said core substrate; and an anisotropic conductive layer which is formed on the other surface of said core substrate, and via which said semiconductor chip is mounted on said core substrate, wherein the electrodes on said core substrate and those on said semiconductor chip being eletrically connected via said anisotropic conductive layer; and wherein, on the core substrate surface on which said built-up layers are built, reinforced patterns are formed at the positions corresponding to the electrodes on said semiconductor chip.

2. The semiconductor device in accordance with claim 1, wherein said interposer substrate is constructed by forming built-up layers on said core substrate, wherein electrodes are each formed so as to be continuous with a conductive portion which passes through said built-up layers, and wherein said electrodes are connected to the motherboard to be affixed thereon.

3. The semiconductor device in accordance with claim 2, wherein, on the outer surface of said built-up layers, no wiring patterns exist at the positions corresponding to said reinforced patterns, and wherein through-holes are formed at the corresponding positions on the motherboard to mount said semiconductor device.

* * * * *